(12) United States Patent
Huang (10) Patent No.: US 11,004,498 B2
(45) Date of Patent: May 11, 2021

(54) MEMORY INTERFACE CIRCUIT, MEMORY STORAGE DEVICE AND CONFIGURATION STATUS CHECKING METHOD

(71) Applicant: PHISON ELECTRONICS CORP., Miaoli (TW)

(72) Inventor: Ming-Chien Huang, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 12 days.

(21) Appl. No.: 16/568,193

(22) Filed: Sep. 11, 2019

(65) Prior Publication Data

US 2021/0027824 A1 Jan. 28, 2021

(30) Foreign Application Priority Data

Jul. 22, 2019 (TW) .................................. 108125767

(51) Int. Cl.
*G11C 11/4063* (2006.01)
*G11C 7/10* (2006.01)
*G11C 29/44* (2006.01)
*G11C 5/06* (2006.01)

(52) U.S. Cl.
CPC .......... *G11C 11/4063* (2013.01); *G11C 5/06* (2013.01); *G11C 7/10* (2013.01); *G11C 29/44* (2013.01)

(58) Field of Classification Search
None
See application file for complete search history.

(56) References Cited

U.S. PATENT DOCUMENTS

2013/0124904 A1* 5/2013 Wang ................. G06F 13/1689
713/401

* cited by examiner

*Primary Examiner* — James G Norman
(74) *Attorney, Agent, or Firm* — JCIPRNET (57) ABSTRACT

A memory interface circuit, a memory storage device and a configuration status checking method are provided. The memory interface circuit is configured to connect a plurality of volatile memory modules and a memory controller. The volatile memory modules include a first volatile memory module and a second volatile memory module. The memory interface circuit includes a first interface circuit and a second interface circuit. The first interface circuit is configured to receive a first signal from the first volatile memory module and transmit a second signal to the second interface circuit through an internal path of the memory interface circuit. The second interface circuit is configured to transmit a third signal to the second volatile memory module according to the second signal to evaluate a configuration status of the memory interface circuit by the third signal.

24 Claims, 4 Drawing Sheets

MEMORY INTERFACE CIRCUIT, MEMORY STORAGE DEVICE AND CONFIGURATION STATUS CHECKING METHOD

CROSS-REFERENCE TO RELATED APPLICATION

This application claims the priority benefit of Taiwan application serial no. 108125767, filed on Jul. 22, 2019. The entirety of the above-mentioned patent application is hereby incorporated by reference herein and made a part of this specification.

BACKGROUND

Technical Field

The invention relates to a memory interface technology, and more particularly, relates to a memory interface circuit, a memory storage device and a configuration status checking method.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In general, a memory controller can automatically check DQS and/or DQ signals received from a volatile memory module and determine whether a clock frequency and/or a phase of the DQS and/or DQ signals are correct by a built-in scan mechanism. However, this scan mechanism can only describe the current status of the DQS and/or DQ signal by textual description (e.g., "pass" or "fail"), which is prone to misjudgment in actual detection.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention provides a memory interface circuit, a memory storage device and a configuration status checking method, which can solve the above problem.

An exemplary embodiment of the invention provides a memory interface circuit, which is configured to connect a plurality of volatile memory modules and a memory controller. The volatile memory modules include a first volatile memory module and a second volatile memory module. The memory interface circuit includes a first interface circuit and a second interface circuit. The first interface circuit is connected to the first volatile memory module through at least one first channel. The second interface circuit is connected to the second volatile memory module through at least one second channel. The first interface circuit is configured to receive a first signal from the first volatile memory module and transmit a second signal to the second interface circuit through an internal path of the memory interface circuit. The second interface circuit is configured to transmit a third signal to the second volatile memory module according to the second signal to evaluate a configuration status of the memory interface circuit by the third signal.

An exemplary embodiment of the invention further provides a memory storage device, which includes a connection interface unit, a rewritable non-volatile memory module, a first volatile memory module, a second volatile memory module and a memory control circuit unit. The connection interface unit is configured to couple to a host system. The memory control circuit unit is coupled to the connection interface unit, the rewritable non-volatile memory module, the first volatile memory module and the second volatile memory module. The memory control circuit unit includes a first interface circuit and a second interface circuit. The first interface circuit is connected to the first volatile memory module through at least one first channel. The second interface circuit is connected to the second volatile memory module through at least one second channel. The first interface circuit is configured to receive a first signal from the first volatile memory module and transmit a second signal to the second interface circuit through an internal path of the memory control circuit unit. The second interface circuit is configured to transmit a third signal to the second volatile memory module according to the second signal to evaluate a configuration status of the memory control circuit unit by the third signal.

An exemplary embodiment of the invention further provides a configuration status checking method for a memory control circuit unit. The memory control circuit unit is coupled to a plurality of volatile memory modules. The volatile memory modules include a first volatile memory module and a second volatile memory module. The configuration status checking method includes: receiving a first signal from the first volatile memory module through a first interface circuit; transmitting a second signal to a second interface circuit through an internal path of the memory control circuit unit by the first interface circuit; transmitting a third signal to the second volatile memory module through the second interface circuit according to the second signal; and evaluating a configuration status of the memory interface circuit according to the third signal.

Based on the above, the first interface circuit in the memory interface circuit can be connected to the first volatile memory module through the first channel, and the second interface circuit in the memory interface circuit can be connected to the second volatile memory module through the second channel. The first interface circuit can receive a first signal from the first volatile memory module and transmit a second signal to the second interface circuit through an internal path of the memory interface circuit. The second interface circuit can transmit a third signal to the second volatile memory module according to the second signal to evaluate a configuration status of the memory interface circuit by the third signal. As a result, an analytical efficiency for subsequent signals from the volatile memory module can be effectively improved.

To make the aforementioned more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Exemplary embodiments are provided below to describe the disclosure in detail, though the disclosure is not limited to the provided exemplary embodiments, and the provided exemplary embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can mean a current, a voltage, a charge, a temperature, data or any one or multiple signals.

It is noted that in the following description, some terms may be replaced with corresponding abbreviations for ease of reading (see Table 1).

TABLE 1

| | |
|---|---|
| rewritable non-volatile memory module | RNVM module |
| volatile memory module | VM module |
| memory storage device | MSD |
| memory control circuit unit | MCCU |

Figure 1:
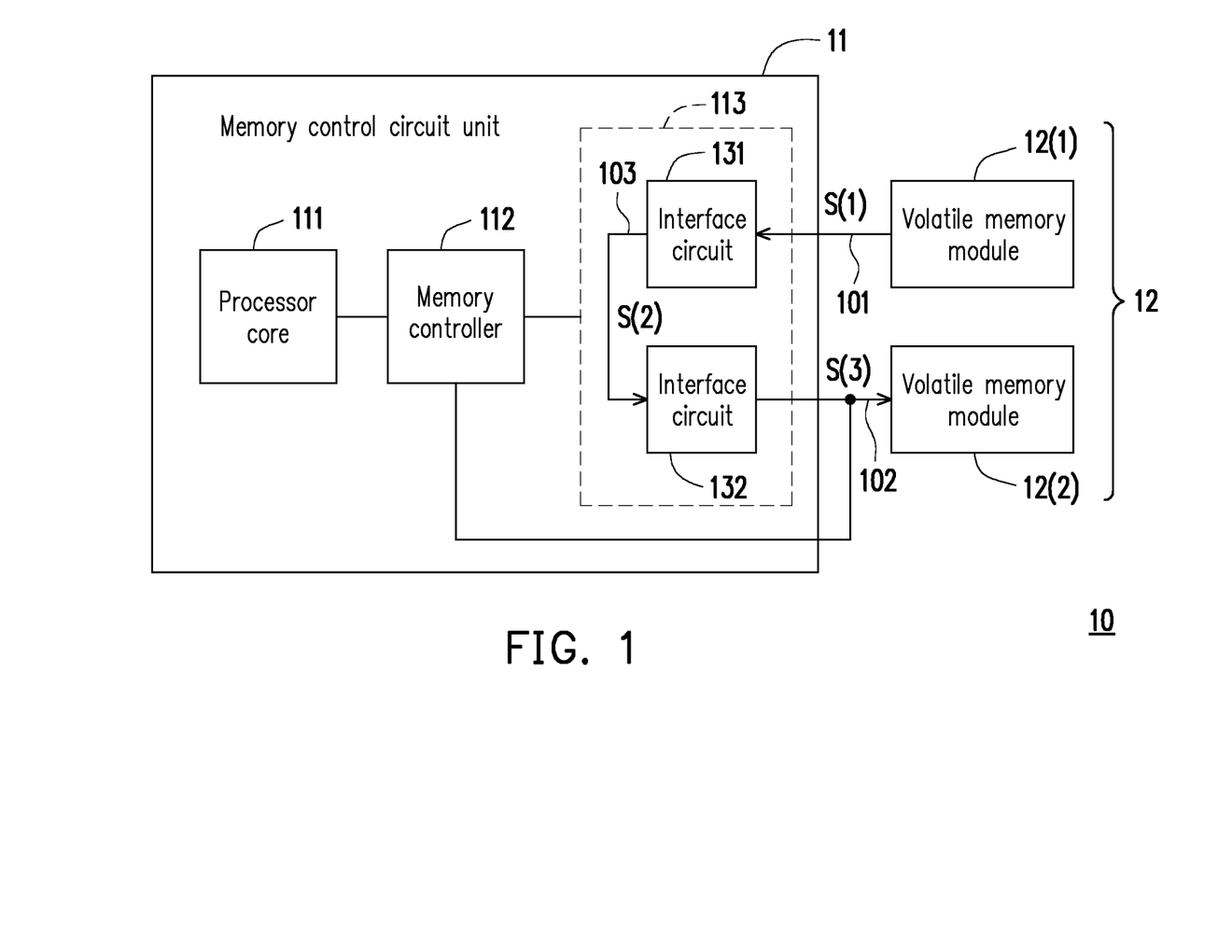
FIG. 1 is a schematic diagram illustrating a memory storage device according to an exemplary embodiment of the invention.

FIG. 1 is a schematic diagram illustrating a MSD according to an exemplary embodiment of the invention. With reference to FIG. 1, a MSD 10 includes a MCCU 11 and a VM module 12. The MCCU 11 and the VM module 12 may be installed on one or more circuit boards in the MSD 10. The MCCU 11 supports separate and/or parallel data access operations for the VM module 12.

In an exemplary embodiment, the MCCU 11 is regarded as a control chip of the VM module 12, and the VM module 12 may be regarded as a cache memory or a buffer memory of the MCCU 11. For example, the VM module 12 may include various types of VM modules including a DDR SDRAM (first generation Double Data Rate Synchronous Dynamic Random Access Memory), a DDR 2 SDRAM (second generation Double Data Rate Synchronous Dynamic Random Access Memory), a DDR 3 SDRAM (third generation Double Data Rate Synchronous Dynamic Random Access Memory), a DDR 4 SDRAM (fourth generation Double Data Rate Synchronous Dynamic Random Access Memory).

In an exemplary embodiment, the MCCU 11 includes a processor core 111, a memory controller 112 and a memory interface circuit 113. The memory controller 112 is coupled to the processor core 111 and the memory interface circuit 113. The processor core 111 is configured to control an overall operation of the MCCU 11 or the MSD 10. For example, the processor core 111 may include a processing chip, such as a CPU (Central Processing Unit) or a microprocessor of single-core or multi-core.

The memory controller 112 serves as a communication bridge between the processor core 111 and the VM module 12 and is dedicated to control the VM module 12. In this exemplary embodiment, the memory controller 112 is also known as a dynamic random access memory controller (DRAM controller).

The memory interface circuit 113 is configured to connect the memory interface circuit 112 (or the MCCU 11) to the VM module 12. When the processor core 111 intends to read data from the VM module 12 or store data into the VM module 12, the memory controller 112 can send a control command to the VM module 12 through the memory interface circuit 113. When the control command is received by the VM module 12, the VM module 12 can store write-data corresponding to the control command or return read-data corresponding to the control command to the memory controller 112 through the memory interface circuit 113.

In an exemplary embodiment, the VM module 12 includes a VM module (a.k.a. a first VM module) 12(1) and a VM module (a.k.a. a second VM module) 12(2). However, in another exemplary embodiment, the VM module 12 may include more VM modules, which are not limited in the invention.

In an exemplary embodiment, the memory interface circuit 113 includes an interface circuit (a.k.a. a first interface circuit) 131 and an interface circuit (a.k.a. a second interface circuit) 132. The interface circuit 131 can be coupled to the VM module 12(1) through a channel (a.k.a. a first channel) 101. The interface circuit 132 can be coupled to the VM module 12(2) through a channel (a.k.a. a second channel) 102. Each of the channels 101 and 102 can include one or more channels.

In an exemplary embodiment, the interface circuit 131 can receive a signal (a.k.a. a first signal) S(1) from the VM module 12(1) through the channel 101. For example, the signal S(1) can include signals DQ and DQS. The signals DQ and DQS match each other. For example, the signal DQ can be a data signal, and the signal DQS can be a clock signal corresponding to the signal DQ. For example, the clock signal DQS can reflect a clock (or a clock frequency) of the data signal DQ. After receiving the signal S(1), the interface circuit 131 can transmit a signal (a.k.a. a second signal) S(2) to the interface circuit 132 through an internal path 103 of the memory interface circuit 113.

It should be noted that the internal path 103 refers to a signal path inside the memory interface circuit 113, and the signal path can be used to transmit the signal S(2). The interface circuit 132 can receive the signal S(2) from the internal path 103. According to the signal S(2), the interface circuit 132 can transmit a signal (a.k.a. a third signal) S(3) to the VM module 12(2) through the channel 102, in order to evaluate a configuration status of the memory interface circuit 113 by the signal S(3).

In an exemplary embodiment, the memory controller 112 can check physical information (e.g., a phase, a frequency, a waveform, and/or an amplitude) of the signal S(3). Based on the physical information of the signal S(3), the memory controller 112 can evaluate whether the configuration status (e.g., a hardware circuit configuration, a software algorithm and/or a system parameter) for modulating the signal S(1) in the current memory interface circuit 113 (or the interface circuit 131) is normal or correct. Alternatively, in an exemplary embodiment, the physical information of the signal S(3) may also be checked by an external device (e.g., an oscilloscope). The memory controller 112 can adjust the configuration status (e.g., the hardware circuit configuration, the software algorithm and/or the system parameter) of the memory interface circuit 113 according to an evaluation result, so as to improve the analytical efficiency for subsequent signals from the VM module 12.

In an exemplary embodiment, the signal S(1) is generated by the VM module 12(1) in response to a read command from the memory interface circuit 113. For example, the signal S(1) may carry read-data indicated by the read command.

In an exemplary embodiment, the interface circuit 131 can generate the signal S(2) according to the signal S(1) such that a phase of the signal S(1) is different from a phase of the signal S(2). For example, the interface circuit 131 can delay the signal S(1) to generate the signal S(2).

In an exemplary embodiment, the interface circuit 132 can directly transmit the signal S(2) as the signal S(3) to the VM module 12(2). The transmitted signal S(3) can be used to evaluate the configuration status of the memory interface circuit 113.

In an exemplary embodiment, the interface circuit 131 can also be regarded as a signal input interface for receiving signals from the VM module 12(1) in the memory interface circuit 113. In an exemplary embodiment, the interface circuit 132 can also be regarded as a signal output interface for outputting signals to the VM module 12(2) in the memory interface circuit 113. In an exemplary embodiment, the signal S(1) received from the interface circuit 131 can also be regarded as being guided to the interface circuit 132 through the internal path 103 for output.

In an exemplary embodiment, the memory controller 112 can evaluate the configuration status of the memory interface circuit 113 by checking the physical information (e.g., the phase, the frequency, the waveform, and/or the amplitude) of at least one of the signals S(1) to S(3). For example, the memory controller 112 can analyze the physical information of the signals S(2) and S(3) (or the signals S(1) to S(3)) and adjust the configuration status (e.g., the hardware circuit configuration, the software algorithm and/or the system parameter) of the memory interface circuit 113 according to an analysis result.

Figure 2:
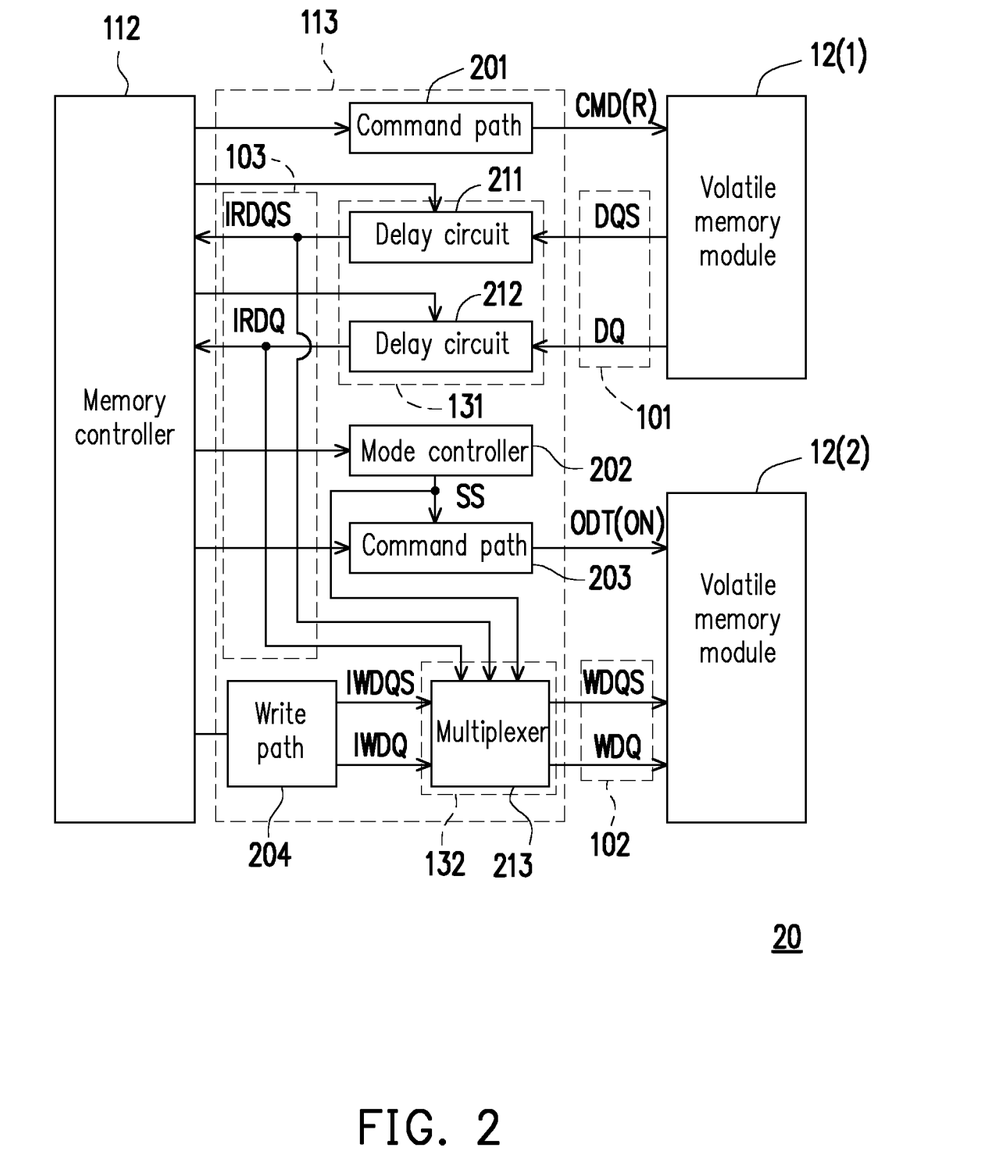
FIG. 2 is a schematic diagram illustrating a memory storage device according to an exemplary embodiment of the invention.

FIG. 2 is a schematic diagram illustrating a MSD according to an exemplary embodiment of the invention. With reference to FIG. 2, a MSD 20 includes the memory controller 112, the memory interface circuit 113, the VM module 12(1) and the VM module 12(2).

In an exemplary embodiment, the memory interface circuit 113 includes the interface circuit 131, the interface circuit 132, a command path 201, a mode controller 202, a command path 203, and a write path 204. When the configuration status of the memory interface circuit 113 is to be checked, the memory controller 112 can transmit a read command CMD(R) to the VM module 12(1) through the command path 201. The read command CMD(R) instructs a reading of data from the VM module 12(1).

In response to the read command CMD(R), the VM module 12(1) can transmit signals DQS and DQ to the memory interface circuit 113 through the channel 101. The signals DQS and DQ can be included in the signal S(1) of FIG. 1. The interface circuit 131 can receive the signals DQS and DQ. The interface circuit 131 can generate signals IRDQS and IRDQ according to the signals DQS and DQ, respectively. The signals IRDQS and IRDQ can be included in the signal S(2) of FIG. 1.

In an exemplary embodiment, the interface circuit 131 includes delay circuits 211 and 212. The delay circuit 211 can be used to delay the signal DQS to generate the signal IRDQS. The delay circuit 212 can be used to delay the signal DQ to generate the signal IRDQ. For example, each of the delay circuits 211 and 212 can include one or more delay units (e.g., amplifiers). Further, the memory controller 112 can control delay stages of the delay circuit 211 and the delay circuit 212, respectively. For example, the memory controller 112 can control the delay stages of the delay circuits 211 and/or 212 according to a phase difference between the signals DQS and DQ. Then, the signals IRDQS and IRDQ can be transmitted to the internal path 103.

In an exemplary embodiment, the interface circuit 132 includes a multiplexer 213. The multiplexer 213 can receive the signals IRDQS and IRDQ on the internal path 103. The multiplexer 213 can transmit signals WDQS and WDQ to the VM module 12(2) according to the signals IRDQS and IRDQ, respectively.

In an exemplary embodiment, when the configuration status of the memory interface circuit 113 is to be checked, the memory controller 112 can instruct the mode controller 202 to activate a check mode. In response to an activation of the check mode, the mode controller 202 can transmit a signal (a.k.a. a selection signal) SS to the multiplexer 213. In response to the signal SS, the multiplexer 213 can transmit the signals IRDQS and IRDQ as the signals WDQS and WDQ, respectively, to the VM module 12(2). The signals WDQS and WDQ can be included in the signal S(3) of FIG. 1.

In an exemplary embodiment, in response to the signal SS, the multiplexer 213 can block signals IWDQS and IWDQ transmitted by the memory controller 112 through the write path 204. One of the signals IWDQS and IWDQ can be used to instruct the VM module 12(2) to perform a data write operation. In other words, after the check mode is activated, in response to the signal SS, the multiplexer 213 can replace the signals IWDQS and IWDQ by the signals IRDQS and IRDQ as the signals WDQS and WDQ to be transmitted to the VM module 12(2), respectively. In an exemplary embodiment, the signals IWDQS and IWDQ are also known as a fourth signal.

In an exemplary embodiment, in response to the activation of the check mode, the mode controller 202 can set a signal on the command path 203 to a signal ODT(ON) by the signal SS. The command path 203 is preset for transmitting the read command of the memory controller 112 to the VM module 12(2). The signal ODT(ON) can be used to activate an ODT (On-Die Termination) circuit of the VM module 12(2). That is to say, in response to the activation of the check mode, the signal ODT(ON) can be transmitted to the VM module 12(2) through the command path 203 to activate the ODT circuit inside the VM module 12(2). In an exemplary embodiment, the signal ODT(ON) is also known as a fifth signal. By the activation of the ODT circuit, reflection of the signal WDQS and WDQ can be reduced, thereby improving a check accuracy.

In an exemplary embodiment, the memory controller 112 can check a phase relative relationship between the signals DQS and DQ (e.g., the phase difference between the signals DQS and DQ), a phase relative relationship between the signals IRDQS and IRDQ (e.g., a phase difference between the signals IRDQS and IRDQ) and/or a phase relative relationship between the signals WDQS and WDQ (e.g., a phase difference between the signals WDQS and WDQ). The memory controller 112 can adjust the current configuration status of the memory interface circuit 113 according to a check result. For example, the memory controller 112 can adjust the current hardware circuit configuration, the current software algorithm, and/or the current system parameter of the memory interface circuit 113 (e.g., adjust the delay stages of the delay circuits 211 and/or 212) according to the check result, so as to improve the analytical efficiency for subsequent signals from the VM modules 12(1) and 12(2).

In an exemplary embodiment, the memory controller 112 can determine whether the check result meets a preset condition. For example, the memory controller 112 can determine whether the phase difference between (any) two of the signals DQS, DQ, IRDQS, IRDQ, WDQS and WDQ meets to a preset phase difference. If the phase difference between said two of the signals DQS, DQ, IRDQS, IRDQ, WDQS and WDQ meets (e.g., equals to) the preset phase difference, the memory controller 112 can determine that the check result meets the preset condition. Otherwise, the memory controller 112 can determine that the check result does not meet the preset condition.

In an exemplary embodiment, if the check result meets the preset condition (e.g., the phase difference between the signals DQS and the DQ meets the preset phase difference), the memory controller 112 can maintain the current configuration status of the memory interface circuit 113. Alternatively, if the check result does not meet the preset condition (e.g., the phase difference between the signals DQS and the DQ does not meet the preset phase difference), the memory controller 112 can adjust the current hardware circuit configuration, the current software algorithm, and/or the current system parameter of the memory interface circuit 113 (e.g., adjust the delay stages of the delay circuits 211 and/or 212). Moreover, in an exemplary embodiment, the memory controller 112 can also check the phase, the frequency, the waveform, and/or the amplitude of any of the signals DQS, DQ, IRDQS, IRDQ, WDQS and WDQ as a reference for evaluating and adjusting the configuration status.

In an exemplary embodiment, after the configuration status of the memory interface circuit 113 is checked, the memory controller 112 can instruct the mode controller 202 to terminate the check mode. In response to a termination of the check mode, the mode controller 202 can stop transmitting the signal SS, and the multiplexer 213 can resume transmitting the signals IWDQS and IWDQ to the VM module 12(2).

Figure 3:
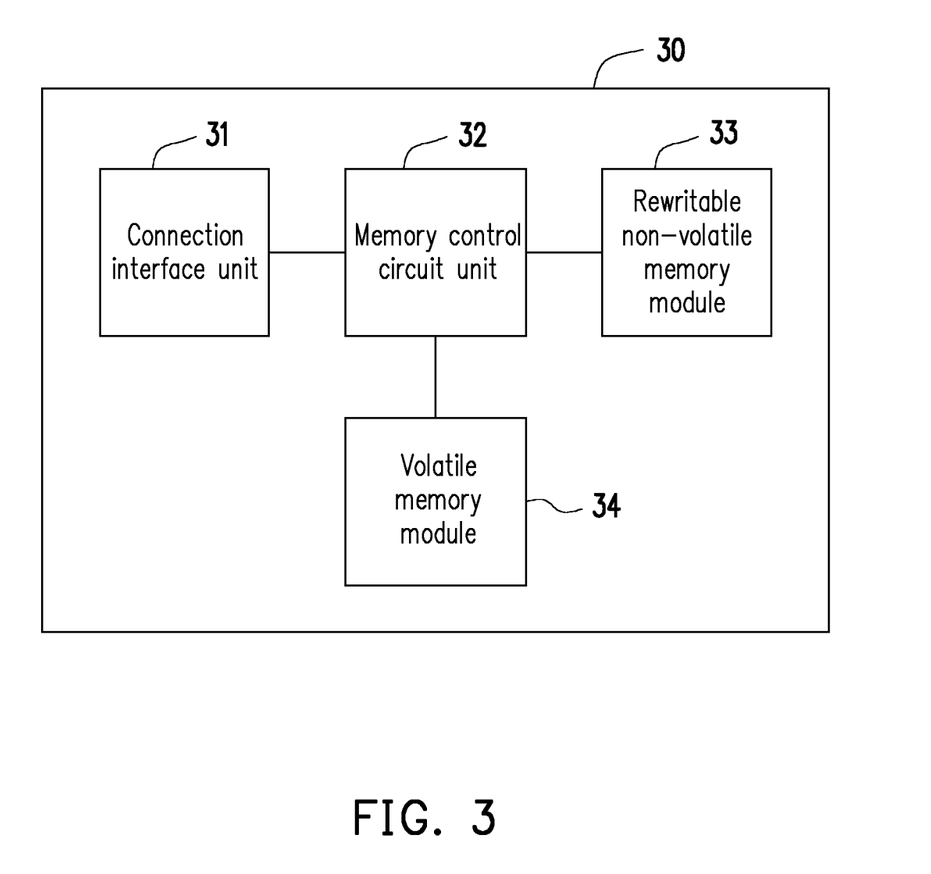
FIG. 3 is a schematic diagram illustrating a memory storage device according to an exemplary embodiment of the invention.

FIG. 3 is a schematic diagram illustrating a MSD according to an exemplary embodiment of the invention. With reference to FIG. 3, a MSD 30 is a MSD including both a RNVM module 33 and a VM module 34, such as a SSD (Solid State Drive). The MSD 30 can be used together with a host system so the host system can write data into the MSD 30 or read data from the MSD 30. For example, the mentioned host system may be any system capable of substantially cooperating with the MSD 30 for storing data, such as a desktop computer, a notebook computer, a digital camera, a video camera, a communication device, an audio player, a video player or a tablet computer.

The MSD 30 includes a connection interface unit 31, a MCCU 32, the RNVM module 33 and the VM module 34. The connection interface unit 31 is configured to couple the MSD 30 to the host system. In an exemplary embodiment, the connection interface unit 31 is compatible with a SATA (Serial Advanced Technology Attachment) standard. Nevertheless, it should be understood that the invention is not limited in this regard. The connection interface unit 31 may also be compatible with a PATA (Parallel Advanced Technology Attachment) standard, a PCI Express (Peripheral Component Interconnect Express) interface standard, a USB (Universal Serial Bus) standard or other suitable standards. The connection interface unit 31 can be packaged into one chip with the MCCU 32, or the connection interface unit 31 can also be distributed outside of a chip containing the MCCU 32.

The MCCU 32 is configured to perform operations of writing, reading or erasing data in the RNVM module 33 according to the control commands. The MCCU 32 can include the MCCU 11 in FIG. 1 to control the VM module 34.

The RNVM module 33 is coupled to the MCCU 32 and configured to store data written from the host system. The RNVM module 33 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Qual Level Cell) NAND-type flash memory module (i.e., a flash memory module capable of storing four bits in one memory cell), other flash memory modules or other memory modules having the same features.

In an exemplary embodiment, the MCCU 32 also includes identical or similar functions and/or electronic circuit structures of the MCCU 11 mentioned in the exemplary embodiments of FIG. 1 and FIG. 2, and the VM module 34 is identical or similar to the VM module 12 mentioned in the exemplary embodiment of FIG. 1. Therefore, description regarding the MCCU 32 and the VM module 34 can refer to the exemplary embodiments of FIG. 1 and FIG. 2, which are not repeated hereinafter.

It should be noted that, the electronic circuit structure illustrated in FIG. 2 is merely a schematic drawing of the memory interface circuit 113 in certain exemplary embodiments instead of limitations to the invention. In certain non-mentioned embodiments, more electronic components can be added to the memory interface circuit 113 or used to replace some existing electronic components to provide additional, identical or similar functionality. Moreover, in certain non-mentioned applications, a circuit layout and/or a coupling relation between elements inside the memory interface circuit 113 may also be properly altered to meet practical requirements.

Figure 4:
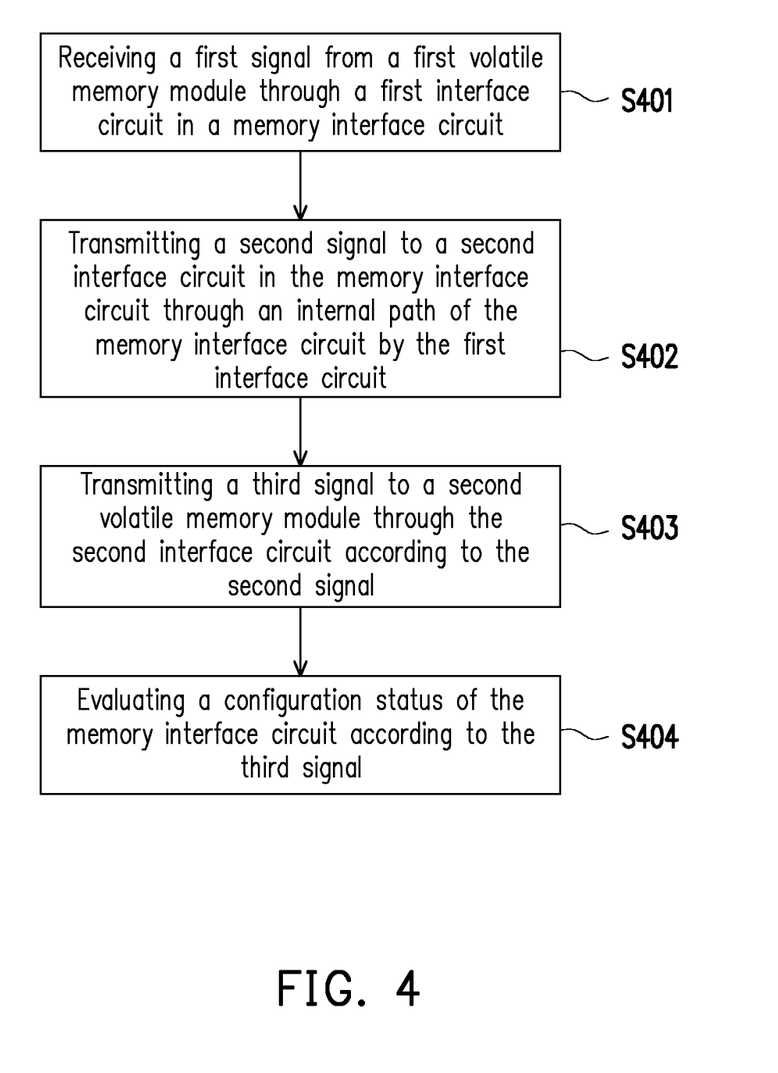
FIG. 4 is a flowchart illustrating a configuration status checking method according to an exemplary embodiment of the invention.

FIG. 4 is a flowchart illustrating a configuration status checking method according to an exemplary embodiment of the invention. With reference to FIG. 4, in step S401, a first signal is received from a first VM module through a first interface circuit in a memory interface circuit. In step S402, a second signal is transmitted to a second interface circuit in the memory interface circuit through an internal path of the memory interface circuit by the first interface circuit. In step S403, a third signal is transmitted to a second VM module through the second interface circuit according to the second signal. In step S404, a configuration status of the memory interface circuit is evaluated according to the third signal.

Nevertheless, steps depicted in FIG. 4 are described in detail as above so that related description thereof is omitted hereinafter. It should be noted that, the steps depicted in FIG. 4 may be implemented as a plurality of program codes or circuits, which are not particularly limited in the invention. Moreover, the method disclosed in FIG. 4 may be implemented by reference with above exemplary embodiments, or may be implemented separately, which are not particularly limited in the invention.

In summary, in the check mode, the memory interface circuit can guide the signals from the first VM module to an output interface corresponding to the second VM module. Accordingly, by checking the signals on the output interface, whether the configuration status of the memory interface circuit is normal or correct can be evaluated accurately. Then, according to the check result, certain settings of the memory interface circuit can be adjusted to effectively improve the analytical efficiency for subsequent signals from the VM module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory interface circuit, configured to couple a plurality of volatile memory modules and a memory controller, wherein the plurality of volatile memory modules comprise a first volatile memory module and a second volatile memory module, and the memory interface circuit comprises:
a first interface circuit, coupled to the first volatile memory module through at least one first channel; and
a second interface circuit, coupled to the second volatile memory module through at least one second channel,
wherein the first interface circuit is configured to receive a first signal from the first volatile memory module and transmit a second signal to the second interface circuit through an internal path of the memory interface circuit, and
the second interface circuit is configured to transmit a third signal to the second volatile memory module according to the second signal, in order to evaluate a configuration status of the memory interface circuit by the third signal.

2. The memory interface circuit according to claim 1, wherein the first signal is generated by the first volatile memory module in response to a read command from the memory interface circuit.

3. The memory interface circuit according to claim 1, wherein the first interface circuit is further configured to generate the second signal according to the first signal, and a phase of the first signal is different from a phase of the second signal.

4. The memory interface circuit according to claim 3, wherein the first interface circuit comprises a delay circuit, and
the delay circuit is configured to delay the first signal to generate the second signal.

5. The memory interface circuit according to claim 4, wherein the first signal comprises a data signal and a clock signal, and
the memory controller is configured to adjust a delay stage of the delay circuit according to a phase difference between the data signal and the clock signal.

6. The memory interface circuit according to claim 1, wherein the second interface circuit comprises a multiplexer, and
the multiplexer is configured to transmit the second signal as the third signal to the second volatile memory module in response to a selection signal.

7. The memory interface circuit according to claim 6, wherein the multiplexer is further configured to block a fourth signal to be transmitted to the second volatile memory module in response to the selection signal.

8. The memory interface circuit according to claim 1, further comprises:
a third interface circuit, coupled to the second interface circuit,
wherein the third interface circuit is configured to transmit a fifth signal to the second volatile memory module to activate an on-die termination circuit of the second volatile memory module by the fifth signal.

9. A memory storage device, comprising:
a connection interface unit, configured to couple to a host system;
a rewritable non-volatile memory module;
a first volatile memory module;
a second volatile memory module; and
a memory control circuit unit, coupled to the connection interface unit, the rewritable non-volatile memory module, the first volatile memory module and the second volatile memory module,
wherein the memory interface circuit comprises a first interface circuit and a second interface circuit,
the first interface circuit is coupled to the first volatile memory module through at least one first channel,
the second interface circuit is coupled to the second volatile memory module through at least one second channel,
the first interface circuit is configured to receive a first signal from the first volatile memory module and transmit a second signal to the second interface circuit through an internal path of the memory control circuit unit, and
the second interface circuit is configured to transmit a third signal to the second volatile memory module according to the second signal, in order to evaluate a configuration status of the memory control circuit unit by the third signal.

10. The memory storage device according to claim 9, wherein the first signal is generated by the first volatile memory module in response to a read command from the memory control circuit unit.

11. The memory storage device according to claim 9, wherein the first interface circuit is further configured to generate the second signal according to the first signal, and a phase of the first signal is different from a phase of the second signal.

12. The memory storage device according to claim 11, wherein the first interface circuit comprises a delay circuit, and
the delay circuit is configured to delay the first signal to generate the second signal.

13. The memory storage device according to claim 12, wherein the first signal comprises a data signal and a clock signal, and
the memory control circuit unit is configured to adjust a delay stage of the delay circuit according to a phase difference between the data signal and the clock signal.

14. The memory storage device according to claim 9, wherein the second interface circuit comprises a multiplexer, and
the multiplexer is configured to transmit the second signal as the third signal to the second volatile memory module in response to a selection signal.

15. The memory storage device according to claim 14, wherein the multiplexer is further configured to block a fourth signal to be transmitted to the second volatile memory module in response to the selection signal.

16. The memory storage device according to claim 9, wherein the memory control circuit unit further comprises:
a third interface circuit, coupled to the second interface circuit,
wherein the third interface circuit is configured to transmit a fifth signal to the second volatile memory module to activate an on-die termination circuit of the second volatile memory module by the fifth signal.

17. A configuration status checking method for a memory control circuit unit, wherein the memory control circuit unit is coupled to a plurality of volatile memory modules, the plurality of volatile memory modules comprise a first volatile memory module and a second volatile memory module, and the configuration status checking method comprises:
receiving a first signal from the first volatile memory module through a first interface circuit;
transmitting a second signal to a second interface circuit through an internal path of the memory control circuit unit by the first interface circuit;
transmitting a third signal to the second volatile memory module through the second interface circuit according to the second signal; and
evaluating a configuration status of a memory interface circuit according to the third signal.

18. The configuration status checking method according to claim 17, wherein the first signal is generated by the first volatile memory module in response to a read command from the memory control circuit unit.

19. The configuration status checking method according to claim 17, further comprising:
generating the second signal by the first interface circuit according to the first signal, wherein a phase of the first signal is different from a phase of the second signal.

20. The configuration status checking method according to claim 19, wherein the first interface circuit comprises a delay circuit, and a step of generating the second signal by the first interface circuit according to the first signal comprises:
delaying the first signal by the delay circuit to generate the second signal.

21. The configuration status checking method according to claim 20, wherein the first signal comprises a data signal and a clock signal, and a step of generating the second signal by the first interface circuit according to the first signal further comprises:
adjusting a delay stage of the delay circuit according to a phase difference between the data signal and the clock signal.

22. The configuration status checking method according to claim 17, wherein the second interface circuit comprises a multiplexer, and a step of transmitting the third signal to the second volatile memory module through the second interface circuit according to the second signal comprises:
transmitting the second signal as the third signal to the second volatile memory module by the multiplexer in response to a selection signal.

23. The configuration status checking method according to claim 22, further comprising:
blocking a fourth signal to be transmitted to the second volatile memory module by the multiplexer in response to the selection signal.

24. The configuration status checking method according to claim 17, further comprising:
transmitting a fifth signal to the second volatile memory module through a third interface circuit to activate an on-die termination circuit of the second volatile memory module by the fifth signal.

* * * * *